United States Patent
Slaughter (10) Patent No.: US 9,576,636 B1
(45) Date of Patent: Feb. 21, 2017

(54) MAGNETIC MEMORY HAVING ROM-LIKE STORAGE AND METHOD THEREFORE

(71) Applicant: Everspin Technologies, Inc., Chandler, AZ (US)

(72) Inventor: Jon Slaughter, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/087,469

(22) Filed: Mar. 31, 2016

Related U.S. Application Data (60) Provisional application No. 62/142,850, filed on Apr. 3, 2015.

(51) Int. Cl.
| | | |
|---|---|---|
| *G11C 11/00* | (2006.01) | |
| *G11C 11/16* | (2006.01) | |
| *G11C 11/18* | (2006.01) | |
| *G11C 13/00* | (2006.01) | |
| *G11C 11/56* | (2006.01) | |

(52) U.S. Cl.
CPC ............ *G11C 11/1675* (2013.01); *G11C 11/00* (2013.01); *G11C 11/1673* (2013.01); *G11C 11/18* (2013.01); *G11C 11/5607* (2013.01); *G11C 13/004* (2013.01); *G11C 13/0035* (2013.01)

(58) Field of Classification Search
CPC .. G11C 11/1673; G11C 11/5607; G11C 11/00; G11C 11/16; G11C 11/18; G11C 13/004; G11C 13/0035; G11C 13/0002
USPC ................ 365/158, 148, 170, 171, 207, 163
See application file for complete search history.

(56) References Cited

U.S. PATENT DOCUMENTS

| 7,339,819 B2* | 3/2008 | Johnson ................. G01R 33/06 |
| | | 257/295 |
| 9,019,754 B1* | 4/2015 | Bedeschi ............. G11C 13/004 |
| | | 365/148 |
| 9,140,747 B2* | 9/2015 | Kim .................... G01R 31/2851 |
| 2013/0227200 A1* | 8/2013 | Cometti .............. G06F 12/0246 |
| | | 711/103 |
| 2016/0064058 A1* | 3/2016 | Janesky ................. G11C 29/12 |
| | | 365/96 |

\* cited by examiner

*Primary Examiner* — Gene Auduong (57) ABSTRACT

A magnetoresistive memory device that stores data in the reference portion of spin-torque memory cells provides for more robust data storage. In normal operation, the memory cells use the free portion of the memory cell for data storage. Techniques for storing data in the reference portions of memory cells are presented, along with techniques for recovering data stored in the reference portions of memory cells.

20 Claims, 7 Drawing Sheets

MAGNETIC MEMORY HAVING ROM-LIKE STORAGE AND METHOD THEREFORE

RELATED APPLICATIONS

This application claims priority to and the benefit of U.S. Provisional Application No. 62/142,850, filed Apr. 3, 2015. The content of application 62/142,850 is incorporated by reference herein in its entirety.

TECHNICAL FIELD

The disclosure herein relates generally to spin-torque magnetoresistive memory devices, and, more particularly, to storing data in such memory devices in a more robust manner.

BACKGROUND

Magnetoresistive memory devices store information with stable magnetic states that result in different device resistances. For example, in certain magnetoresistive memory devices, the resistance across a magnetic tunnel junction (MTJ), and therefore the voltage drop for a specific current, depends on the relative magnetic states of the magnetic layers within the memory cell. In such memory devices, there is typically a portion of the memory cell that has a "reference" magnetic state and another portion that has a "free" magnetic state that is controlled to be either parallel or antiparallel to the reference magnetic state. Because the resistance through the memory cell changes based on whether the free portion is parallel or antiparallel to the reference portion, information can be stored by setting the orientation of the free portion. The information is later retrieved by sensing the orientation of the free portion. Such magnetic memory devices are well known in the art. As described herein, the free portion may be referred to as a "free layer" and the reference portion may be referred to as a "reference layer" even though each of the free and reference portions may be made up of many layers of both ferromagnetic and non-ferromagnetic materials.

While magnetoresistive memory devices provide non-volatile storage under many operating conditions, there is a need for more robust data storage in such devices such that the data is maintained even after the memory is exposed to adverse conditions, including the heat associated with soldering operations and/or packaging.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Magnetoresistive memory is non-volatile in the sense that once a data bit is stored in a magnetoresistive memory cell, removal of power to the memory device will not result in the data being lost. In some instances, it is desirable to store data within a magnetoresistive memory during production of the memory for later use in a system. For example, a magnetoresistive memory device may be preprogrammed during manufacturing, where the information stored on the magnetoresistive memory device is later used after the magnetoresistive memory device is placed within a system. Placing the memory device, which may already be a packaged part, into the system may include soldering the packaged part onto a printed circuit board. The pre-programming performed during manufacturing may occur during testing (e.g., wafer probe) when the memory is already being exercised, and therefore a separate programming operation in the system is unnecessary.

While it is sometimes desirable to preprogram magnetoresistive memory devices during manufacturing, such preprogrammed data can sometimes be lost due to exposure to magnetic fields, high temperatures, or other conditions that can disrupt the magnetic state of the free portions of the memory cells. For example, the high temperatures associated with soldering operations when a device is mounted to a printed circuit board can result in the loss of such preprogrammed data. Because the magnetic moment of the free layer is intended to be changed during read/write operations, the free layer is more susceptible to unintentional changes to its magnetic state. In contrast, the reference layer of the memory cell is designed with a much more robust magnetic structure that is intended to remain in the same magnetic state during the operations associated with reading and writing to the memory cell.

As described herein, a magnetic random access memory having ROM-like capabilities stores data in a manner that is less susceptible to corruption by magnetic fields, heat, etc. The more robust retention of preprogrammed data is accomplished by using the reference layer within the memory cell to store data rather than relying on the free layer, which is much more susceptible to unintentional changes to its magnetic state. Like the free layer, the reference layer can be oriented in two distinct magnetic states. In a conventional magnetoresistive random access memory, all of the magnetic states corresponding to the reference layers of the memory cells are typically aligned in the same direction. This can be accomplished during manufacturing by applying a strong orientating magnetic field to the memory that forces all of the reference layers into the desired magnetic state. As described herein, placing some of the reference layers in one magnetic state and other reference layers in the other magnetic state enables ROM-like data storage using the reference layers while still permitting normal read/write capability utilizing the free layer in each memory cell.

In different embodiments, different reference layers are used within the memory cells. In some embodiments, the reference layer may be an unpinned synthetic antiferromagnetic structure (SAF), whereas in other embodiments a pinned SAF or other reference layer configuration is used. Such reference layers are known in the art and typically include at least two ferromagnetic layers separated by a non-ferromagnetic coupling layer. The coupling layer provides for antiferromagnetic coupling between the two ferromagnetic layers.

Figure 1:
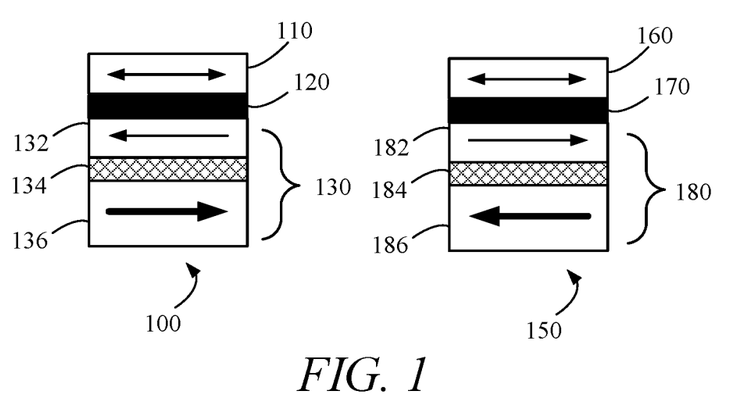
FIG. 1 is a block diagram showing data storage using the reference layer for in-plane magnetoresistive memory devices in accordance with an exemplary embodiment.

FIG. 1 illustrates two example magnetoresistive devices 100 and 150 having two different reference layer orientations. The examples illustrated in FIG. 1 are in-plane devices in that the easy axis of each of the magnetic layers included in the devices is oriented in the film-plane of the ferromagnetic layers. Magnetoresistive device 100 includes reference layer 130, tunnel barrier 120, and free layer 110. Reference layer 130 includes magnetic layers 136 and 132 separated by coupling layer 134. As shown by the arrows, which represent the magnetic moments of the ferromagnetic layers, magnetic layers 136 and 132 are antiferromagnetically coupled by the coupling layer 134 to form a SAF. The double-ended arrow in the free layer indicates that it can be manipulated during normal operation between the two states in order to store data. Magnetoresistive device 150 includes reference layer 180, tunnel barrier 170, and free layer 160. Reference layer 180 includes magnetic layers 186 and 182 separated by coupling layer 184. As shown, the reference layer 130 of device 100 has the opposite orientation as the reference layer of device 150.

Figure 2:
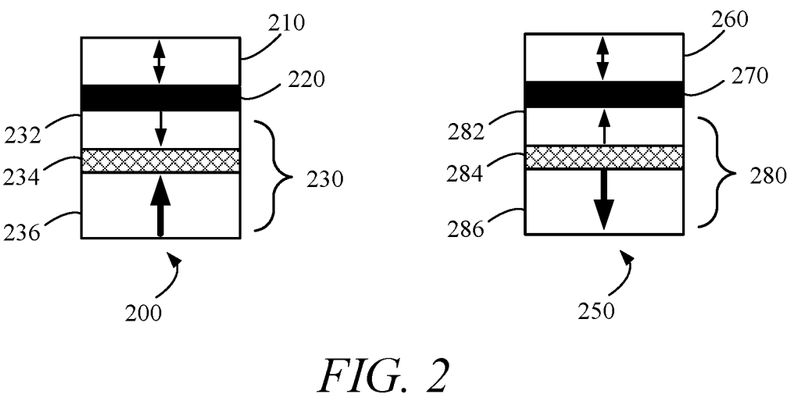
FIG. 2 is a block diagram showing data storage using the reference layer for perpendicular magnetoresistive memory devices in accordance with another exemplary embodiment.

FIG. 2 illustrates two additional example magnetoresistive devices 200 and 250 having different reference layer orientations. The examples illustrated in FIG. 2 are perpendicular devices in that the easy axis of the magnetic layers included in the devices is oriented perpendicular to the film plane of the layers. Magnetoresistive device 200 includes reference layer 230, tunnel barrier 220, and free layer 210. Reference layer 230 includes magnetic layers 236 and 232 separated by coupling layer 234. As shown by the arrows, magnetic layers 236 and 232 are antiferromagnetically coupled to form a SAF. Similarly, magnetoresistive device 250 includes reference layer 280, tunnel barrier 270, and free layer 260. Reference layer 280 includes magnetic layers 286 and 282 separated by coupling layer 284. As shown, the reference layer 230 of device 200 has the opposite orientation as the reference layer of device 250.

Thus, FIGS. 1 and 2 illustrate two types of devices where each type of device has two different potential states for the reference layer. The present disclosure uses the state of the reference layer to store data. The state of the reference layer can be forced to one of the two potential states during manufacturing. During manufacturing steps such as wafer probing, external magnetic fields, heating, and other atypical conditions are available to force the reference layer for the devices into a desired state corresponding to the data to be stored. Such atypical conditions are not typically encountered in the normal operation of the finished part.

In some embodiments, combinations of stimulus are applied to get the reference layer into the desired state. For example, a bias voltage can be applied across the memory cell, where the bias voltage produces a write current through the tunnel junction of the memory cell. Spin-polarized electrons in the write current exhibit torque on the magnetic state of the reference layer and an opposite torque on the magnetic state of the free layer. During normal operation in which the free layer is used to store information, a similar write current is used to switch the magnetization state of the free layer while the magnetization of the reference layer does not change. However, when storing data in the reference layer, the write current, in combination with an applied external magnetic field, forces the magnetization of the reference layer to a particular state. The external magnetic field adds additional torque to that being applied to the reference layer by the write current such that the magnetization of the reference layer is forced to the desired state. Note that the external magnetic field holds the free layer in a particular state, thereby allowing the free layer to be used to spin-polarize the electrons in the write current to exhibit the desired torque on the reference layer. While the torque exhibited by the write current may not be adequate to cause the reference layer to enter the desired magnetic state by itself, additional torque is provided by the external magnetic field applied simultaneously with the write current. Such external magnetic fields are commonly used during manufacturing of magnetoresistive memories. Application of such fields during wafer probe along with the write current can be used to obtain the desired orientation of individual reference layers within the memory as the current provides for selectivity between devices on the memory so that only certain reference layers are subjected to the combined force of the spin-torque current and applied magnetic field.

In some embodiments, a first current and magnetic field are applied to put some of the reference layers into a first state and another current and magnetic field are applied to put others of the reference layers into a second, opposite state. In other embodiments, the entire array of memory cells in the memory can initially have their states set to a "reset state" (i.e. the first state) so that only those cells having a data value corresponding to the "set state" (i.e. the second state) need to be written. The reset state for all cells can be realized by putting the entire wafer in a large magnetic field of sufficient magnitude to force all of the reference layers into the reset state. Later, some of the cells can be forced from the reset state to the set state using a combination of a write current and an external field, where neither the write current nor the magnetic field is enough to force a change of state by itself.

Figure 3:
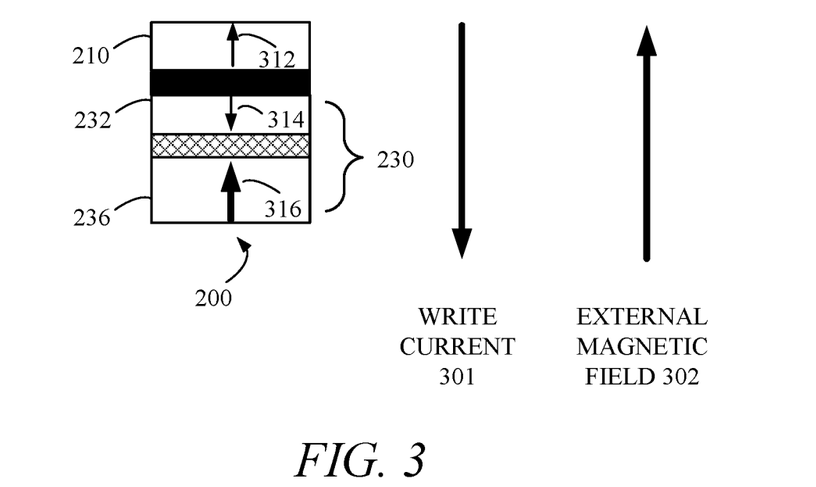
FIGS. 3 and 4 are block diagrams showing currents and magnetic fields applied to a magnetoresistive memory cell to store data in the reference layer of the memory cell in accordance with exemplary embodiments.

Turning to FIG. 3, the reference layer 230 of memory cell 200 includes magnetic layers 236 and 232. Assuming that the magnetic moment 316 of magnetic layer 236 is greater than the magnetic moment 314 of magnetic layer 232, applying external magnetic field 302 in the upward direction will force the magnetic moment 312 of the free layer 210 to point upward. The magnetic field 302 is preferably not strong enough to force the magnetic moment 316 of magnetic layer 236 to point upward. However, the torque applied by the field is directed towards forcing the magnetic moment 316 to point upward. For memory cells that are to be forced to the state shown, a write current 301 is sent through those memory cells, where the write current 301 favors alignment of the magnetic moment 312 with the magnetic moment 316 in the reference portion. Because the magnetic field 302 forces the magnetic moment 312 of the free layer 210 into alignment with the magnetic field, the downward directed current will provide additional torque on the reference layer to supplement that provided by the magnetic field 302. Thus, in the presence of the magnetic field 302, the free layer 210 functions as a reference layer that spin-polarizes electrons in the write current 301. The combination of the torque from the spin-torque write current 301 and the external magnetic field 302 is sufficient to cause the reference layer of the memory cell to take on the desired state shown in FIG. 3.

In one example embodiment corresponding to FIG. 3, the wafer containing a plurality of memories is first placed in a strong magnetic field that forces the initial magnetic moments 316 of all of the reference layers 236 to the downward direction in order to reset all of the memory cells to a first state. In order to force some of the memory cells to the second state, and thereby allow data storage based on the differentiations between the first and second states, an external magnetic field 302 is applied at the same time as write current 301 is directed through the memory cells to write the memory cells to the second state.

Figure 4:
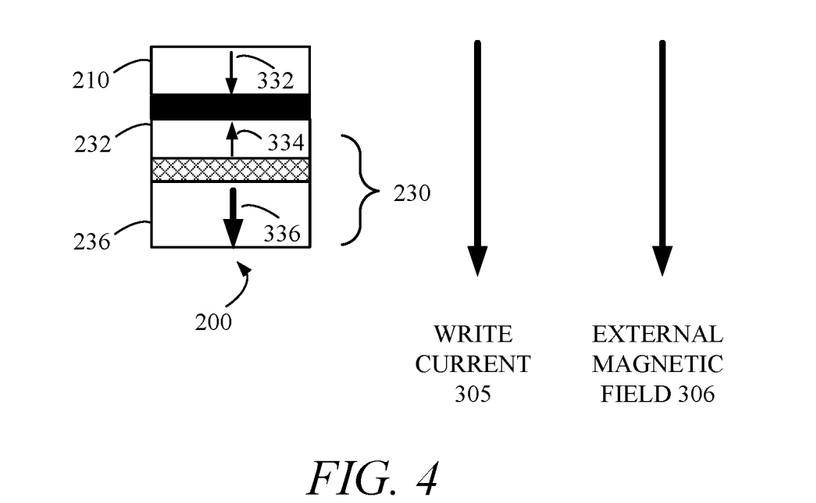

FIG. 4 illustrates the same memory cell with the reference layer being written to the opposite state of that shown in FIG. 3. In FIG. 4, the external magnetic field 306 is directed downward and, as a result, orients magnetic moment 332 of the free layer 210 in the downward direction. The external magnetic field 306 also exerts torque on the reference layer moment 336 where that moment is directed to orient the magnetic moment 336 of the magnetic layer 236 in the downward direction. However, the external field alone is inadequate to force the reference layer into that state. As such, write current 305 is applied, where the downward write current 305 supplements the torque induced by the magnetic field 306. The write current 305 favors the magnetic moment 332 of the free layer 210 being aligned with the magnetic moment 336 of the magnetic layer 236. Magnetic layers 232 and 236 are antiferromagnetically coupled, so that when magnetic moment 336 aligns with the external magnetic field 306 in the downward direction as a result of the write current 305, the magnetic moment 334 of magnetic layer 232 is oriented in the opposite, upward direction.

In an embodiment corresponding to FIG. 4, the wafer may initially be subjected to a strong external field in the upward direction such that the "reset state" or "first state" for the memory cells corresponds to the magnetic moments of the magnetic layers 236 being in the upward direction. Changing that initial state to the "set state" or "second state" is accomplished by applying the downward external magnetic field 306 and selectively applying the write current 305 to those cells that are intended to be switched.

In other embodiments, alternative methods of writing data to the reference layers may be used. For example, instead of only using an external magnetic field to lower the switching barrier to allow for spin-torque switching of the reference layers, a combination of an external magnetic field and elevated temperature are used together to lower the switching barrier. In other embodiments, other techniques are used to lower the switching barrier so that spin-torque switching of the reference layer is possible.

While storing data using the reference layers of the memory cells provides more robust storage than using the free layers, even more immunity to errors can be achieved by writing the same data to multiple locations in the memory array. In one example embodiment, the same bit of data is written to three separate memory cells where a majority decision can be used to determine the value of the data bit stored. In other embodiments, each bit of data is stored in a high-low pair of memory cells where one cell is referenced to the other. In yet other embodiments, entire blocks of data can be repeated in multiple locations within the memory array. Different levels of redundancy may be appropriate in different applications.

Reading the data stored in the reference layers is different than reading data stored in free layers. Spin-torque switching of the free layer 210 does not provide enough information to determine the state of the reference layer 236. As is known, during operation of a spin-torque magnetic memory, write currents through the memory cell are used to change the orientation of the free layer. Such write currents are of sufficient magnitude to switch the free layer, but not of sufficient magnitude to influence the reference layer.

Figure 5:
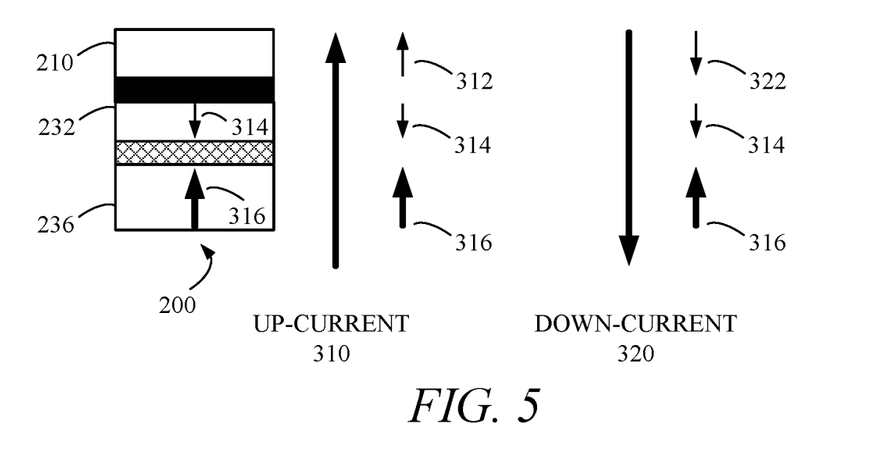
FIGS. 5 and 6 are block diagrams showing currents applied to a magnetoresistive memory cell when reading data stored in the reference layer of the memory device in accordance with exemplary embodiments.

FIG. 5 illustrates memory cell 200 having a first reference layer configuration in which the magnetic moment 316 of magnetic layer 236 is directed upward and the magnetic moment 314 of magnetic layer 232 is directed downward. When a write current directed upward (up-current 310) is applied, the magnetic moment 312 of the free layer 210 is caused to antialign with the magnetic moment 314 of the magnetic layer 232. For a write current directed downward (down-current 320), the magnetic moment 322 of the free layer 210 is caused by spin-torque transfer to be parallel to the moment 314 of reference layer 232.

Figure 6:
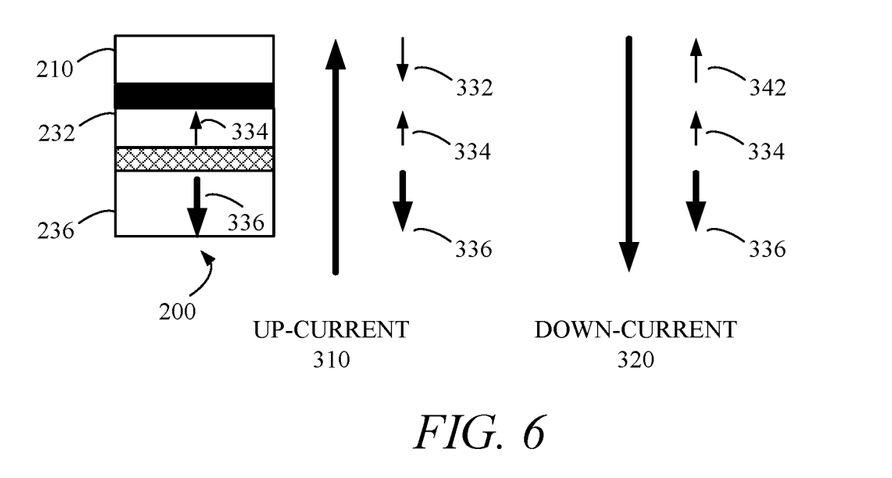

In FIG. 6, the same memory cell is shown having a second reference layer configuration in which the magnetic moment 336 of magnetic layer 236 is directed downward and magnetic moment 334 of magnetic layer 232 is directed upward. For an up-current 310, the magnetic moment 332 of the free layer 210 antialigns with the magnetic moment 334 of the reference layer 236. For a down-current 320, the magnetic moment 342 of the free layer 210 is forced upward and aligns with the moment 334 of the magnetic layer 232.

Thus, as can be seen from FIGS. 5 and 6, the up-current 310 always results in the magnetic moment of the free layer 210 being opposite that of the magnetic layer 232 just across the tunnel barrier, which corresponds to the high-resistance state for the memory cell. Likewise, the down-current 320 always results in the magnetic moment of the free layer 210 being in the same direction as that of the magnetic layer 232, which corresponds to the low-resistance state for the memory cell. As such, while the up-current and down-current enable the free layer to be used to store data, the state of the reference layer cannot be detected based on the limited information provided in response to the up-current and the down-current.

In order to read the data stored in the reference layers of the memory cells in the memory, the free layers for the memory cells are first placed into a known state so that each free layer can be used as a temporary reference layer for determining the state of a corresponding reference layer. In some embodiments, the free layers are set to a known state by applying a magnetic field to the array that is large enough to switch all of the free layers, but not so large as to switch any of the reference layers. In one example embodiment, the magnetic field used to set the free layers to a known state may be applied shortly after soldering the memory to a printed circuit board. Because such soldering uses high temperatures (e.g. on the order of 260-265 degrees Celsius), applying the magnetic field while the part is still hot can allow the free layers to be placed in the known state with a low-magnitude magnetic field. Once the part has cooled, a larger field may be required to set the free layers to a known state.

Once the free layer for a memory cell has been set to a known state, a self-referenced read operation using the free layer (which is in a known state) as the temporary reference layer is used to determine the state of the reference layer. The initial resistance through the memory cell is sampled, write current is sent through the memory cell in either the upward or downward direction, the resistance through the memory cell is sampled again, and the two sampled resistances are compared to determine the state of the reference layer. For example, if the free layer is initially set to correspond to the magnetic moment 312 shown in FIG. 5 and an up-current 310 is applied after the initial resistance sampling, if the resulting resistance is the same as the initial resistance, then the state of the reference layer corresponds to first configuration shown in FIG. 5. If the resistance after applying the write current is greater than the initial resistance, then the free layer 210 has switched from the upward direction 342 to the downward direction 332 as a result of the up-current 310, and therefore the reference layer is in the state corresponding to the second configuration as shown in FIG. 6. While the embodiments described herein focus on self-referenced read schemes, in other embodiments, a midpoint read scheme or other read schemes may be used.

While an unpinned-SAF is illustrated in the example embodiments of FIGS. 1-6, a pinned SAF that includes antiferromagnetic material may be used in other embodiments. In order to store information in the pinned SAF, the memory may be heated beyond the blocking temperature of the pinning material such that an applied magnetic field is sufficient to change the orientation of the reference magnetic field of the pinned SAF. Thus, although the reference layer is fixed during normal operation, sufficient heating and exposure to magnetic fields allows this reference layer to be manipulated and used to store data.

While the examples in FIGS. 2-6 correspond to perpendicular memory devices, in-plane memory devices such as those depicted in FIG. 1 can also be used where data is stored in the reference layer. Programming such in-plane memory devices includes externally applied magnetic fields with simultaneous spin-torque current. The external magnetic fields are selected to be insufficient to change the reference layer without the supplementary force provided by spin-torque current. The combination of the magnetic fields and spin-torque currents force the reference layer to assume a selected orientation that can later be detected using the free layer as a reference.

The discussion above focuses on programming the states of the reference layer during manufacturing as magnetic fields, higher temperatures, and electrical access to the memory cells is readily available during manufacturing (e.g., at wafer probe). However, such programming can be performed after manufacturing is completed given proper programming conditions.

Figure 7:
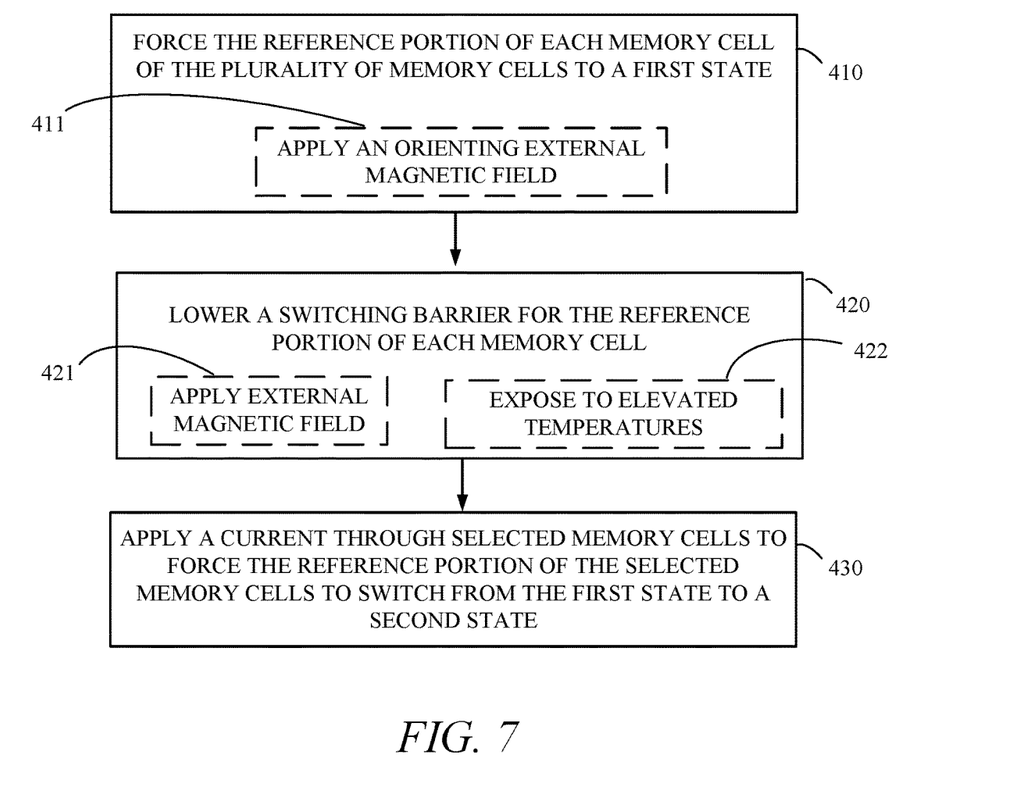
FIGS. 7 and 8 are flow charts illustrating methods of operation of memory devices in which data is stored in the reference layer in accordance with exemplary embodiments.
Figure 8:
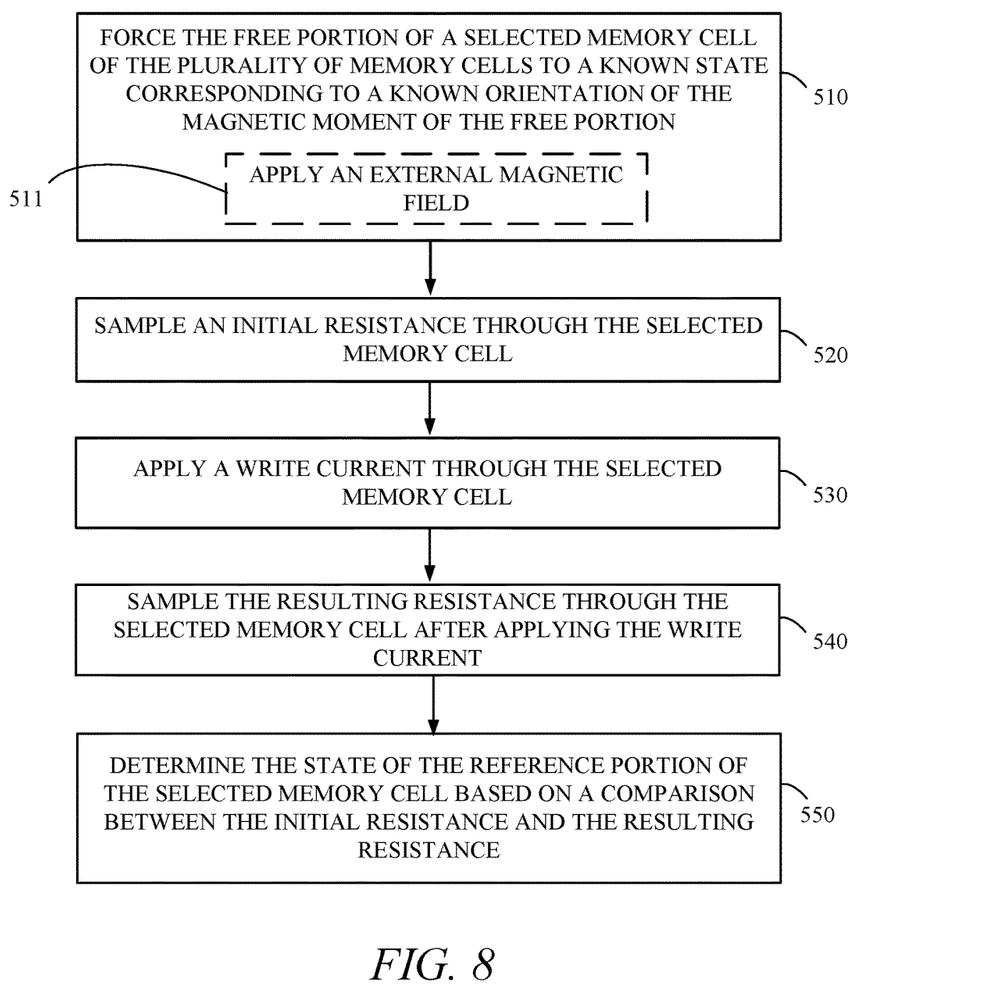

FIGS. 7-8 are flow charts that illustrate exemplary embodiments of methods of operation of magnetoresistive memory devices in which data is stored in the orientation of the magnetic moment of the reference layers in the memory devices. The operations included in the flow charts may represent only a portion of the overall process used in operating the memory. For illustrative purposes, the following description of the methods in FIGS. 7-8 may refer to elements mentioned above in connection with FIGS. 1-6. It should be appreciated that methods may include any number of additional or alternative tasks, the tasks shown in FIGS. 7-8 need not be performed in the illustrated order unless specified otherwise, and the methods may be incorporated into a more comprehensive procedure or process having additional functionality not described in detail herein. Moreover, one or more of the tasks shown in FIGS. 7-8 can be omitted from an embodiment as long as the intended overall functionality remains intact.

Figure 9:
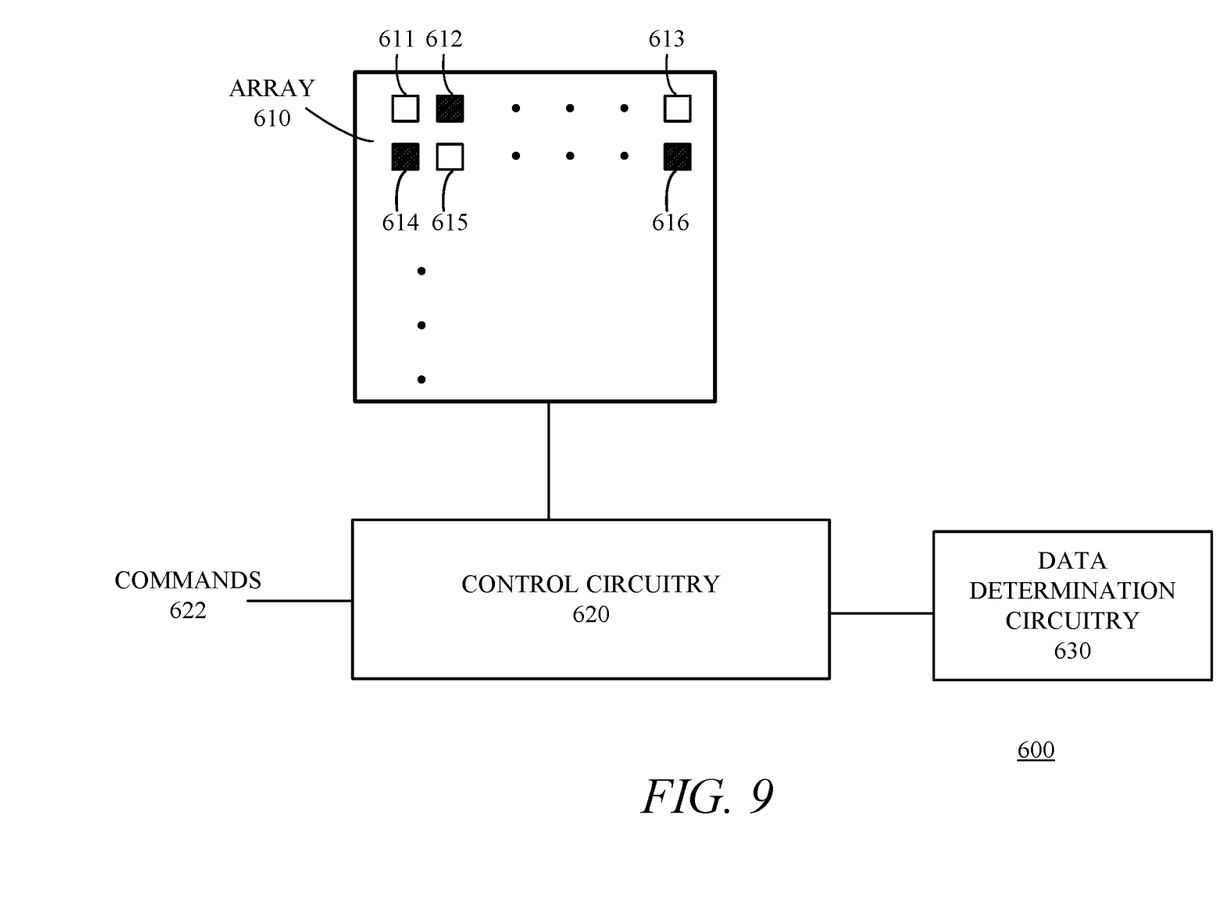
FIG. 9 is a schematic diagram of a portion of a magnetic memory device in accordance with another exemplary embodiment.

FIGS. 7 and 8 illustrate flow charts of a method for operating a magnetoresistive memory device in which data is stored based on the orientation of the reference layers of at least a portion of the memory cells included in the memory device. FIG. 9 illustrates a block diagram of a portion of such a memory device and some of the circuitry that is included in some embodiments. In some embodiments, the magnetoresistive memory device includes an array of spin-torque magnetoresistive memory cells that are randomly accessible (e.g. MRAM). In some embodiments, the spin-torque memory cells are in-plane memory cells such as those illustrated in FIG. 1, whereas in other embodiments, the spin-torque memory cells are perpendicular memory cells such as those illustrated in FIG. 2. Thus, the magnetoresistive memory includes a plurality of non-volatile magnetoresistive memory cells, where each memory cell includes a reference portion and a free portion. During normal operation, data is written into each memory cell by forcing a magnetic moment of the free portion into one of a parallel and an antiparallel orientation with respect to a magnetic moment of the reference portion. However, as discussed above, in some applications it is desirable to store data in a more robust manner than is available using the free portion of each memory cell.

In FIG. 7, data is stored in the reference layer of one or more memory cells in the memory device, thereby providing for more robust storage that can tolerate exposure to higher temperatures and magnetic fields without losing data. At 410, the reference portion of each memory cell in the memory device is forced into a first, known state. In an in-plane memory device example, the orientation of the magnetic moments of the reference portions of all of the memory cells are forced to point to the right as shown in the memory cell 100 depicted in FIG. 1. In some embodiments, this is accomplished at 411 by applying an orientating external magnetic field of sufficient magnitude to change the orientations of all of the reference portions. In other embodiments, a combination of an orienting external magnetic field and elevated temperature is used to force the orientations of all of the reference portions to a predetermined state. This is considered to be the "reset" state for each of the memory cells.

At 420, the switching barrier for the reference portion of each memory cell is lowered. In other words, the memory device is subjected to conditions that make the magnetic states of the reference portions more susceptible to modification. Such conditions can include exposing the memory device to elevated temperatures at 422 and/or applying an external magnetic field to the device at 421. While higher temperatures and magnetic fields can be applied to the device at any point in time, such conditions are readily available during testing operations such as wafer probe.

Once the switching barrier has been lowered, a current is applied through selected memory cells to force the reference portion of the selected memory cells to switch from the first state to a second state. In an in-plane example shown in FIG. 1, the first state corresponds to memory cell 100 in which the magnetic moment of the reference portion 136 points to the right, whereas the second state corresponds to memory cell 150 in which the magnetic moment of the reference portion points to the left. Thus, as discussed above, while the magnetic field and/or heat applied at 420 lowers the switching barrier of the reference portion, those conditions are insufficient to change the magnetic moment of the reference portion without the additional torque provided by the spin-torque current applied at 430. The spin-torque current applied to selected cells at 430 allows some memory cells to be left in the first, "reset" state, whereas others are forced to the second, "set" state. This provides for more robust data storage in which the first state corresponds to one binary value, whereas the second state corresponds to the other binary value.

Note that while the example embodiment of FIG. 7 places all of the memory devices in the "reset" state initially, in other embodiments, that step can be omitted. In such embodiments, a first magnetic field can be applied along with a first current to place some of the memory cells in to the first state, whereas a second magnetic field and a second current is used to place other memory cells into the second state.

Data stored in the reference layers of memory cells according to methods such as that shown in FIG. 7 can be recovered using methods such as that illustrated in FIG. 8. At 510, the free portion of a selected memory cell is forced to a known state corresponding to a known orientation of the magnetic portion of the free portion. In some embodiments, this is accomplished by exposing the memory device to an external magnetic field at 511. In other embodiments, other techniques can be applied to force the free portion to a known orientation.

Once the free portion has been oriented to a known state at 510, the initial resistance through the selected memory cell is sampled at 520. Sampling the resistance can include applying a bias voltage across the memory cell and detecting the magnitude of a resulting current through the memory cell.

At 530, after sampling the initial resistance, a write current is applied through the selected memory cell. As discussed above with respect to FIGS. 5 and 6, the write current can be an up-current or a down-current. Depending on the orientation of the reference portion of the memory device, the current applied at 530 may or may not cause the free portion of the memory cell to change state.

After applying the write current at 530, the resulting resistance through the memory cell is sampled at 540. At 550, the state of the reference portion of the selected memory cell is determined based on a comparison between the initial resistance and the resulting resistance. Note that while the term "sample" is used to describe detecting the resistance through the memory cell at the point in time after the write current has been applied, it should be understood that the resistance need not be captured or stored in some manner. Similarly, while the resistance before and after the write current is used for comparison to determine the state of the reference portion, that resistance can be represented by a voltage drop across the memory cell for a known current or by a current level through the memory device for a known voltage across the memory cell. In other words, the comparison at 550 can be a voltage or current comparison.

The flow chart of FIG. 8 corresponds to using a self-referenced read to determine the orientation of the reference layer of the selected memory cell. If the resistance changes after applying the write current, the free portion of the device has changed its orientation. As discussed above with respect to FIGS. 5 and 6, the change in orientation (or lack thereof) along with the direction of current sent through the memory device (up-current or down-current) provides the information necessary to determine the orientation of the reference layer and the data state stored therein.

FIG. 9 is a block diagram of a portion of a memory device 600 that includes a plurality of non-volatile memory cells 611-616 that are included in an array 610. Each of the memory cells 611-616 includes a free portion and a reference portion as discussed above. In the example illustrated, a first set of memory cells 611, 613, and 615 includes memory cells having a reference portion with a first magnetic state (e.g. as depicted in memory cell 100 of FIG. 1 or memory cell 200 of FIG. 2). A second set of memory cells 612, 614, and 616 includes memory cells having a reference portion with a second magnetic state (e.g. as depicted in memory cell 150 of FIG. 1 or memory cell 250 of FIG. 2).

Control circuitry 620 is coupled to the array 610 and asserts the control signals to the portions of the array and other circuitry on the memory device that is used to determine the orientation of the reference portions of the memory cells such that the data stored therein can be recovered. The control circuitry can also include write drivers, sense amplifiers, row and column selection circuitry, etc. Because reading the data stored in the reference portions of the memory devices includes operations that are also associated with reading and writing data based on the magnetic state of the free portions of the memory devices, in some embodiments, the control circuitry 620 also controls such operations relying on data stored in the free layers. For example, in some embodiments, control circuitry 620 is configured to write data into a selected memory cell by applying a write current (e.g. up-current or down-current) through the memory cell to force the free portion of the memory cell to have a magnetic moment that is either parallel or anti-parallel to the reference portion of the memory cell. Reading data stored in the free portion can be accomplished by a self-referenced read operation that determines whether the magnetic moment of the free portion is parallel or antiparallel to that of the reference portion. Such reading and writing operations can be performed in response to commands 622 received by the control circuitry.

In order to read data stored in the reference portion of memory cells 611-616, the free portions of the memory cells are placed into a known state. In some embodiments, this is accomplished with an externally applied magnetic field. Once the free portions are in a known state, the control circuitry 620 is configured to perform a self-referenced read of the data stored in the reference portion. In order to do this, the free portion, which has been set to a known state, is used as a reference.

In order to read the data stored in the reference portion of a memory cell, the control circuitry 620 is configured to first sample the initial resistance of the memory cell with the free portion in a known state. Next, a write current is applied through the memory device. Depending on the state of the reference portion of the memory device, the write current will either cause the free portion of the memory device to change state or remain in the same state. As such, after applying the write current, the resulting resistance is sampled and compared with the initial resistance to determine if the free portion was caused to change state by the write current applied. The state of the reference portion of the memory cell can then be determined based on the direction of current applied and whether or not the state of the free portion changed. In one example, applying an up-current write to each of memory cells 611 and 612 after setting their free portions to a known initial state will cause the free portion in memory cell 611 to change state while the free portion of memory cell 612 stays the same. In such an example, the reference portion of memory cell 611 may indicate a binary "0," while the reference portion of memory cell 612 indicates a binary "1."

As noted above, in other embodiments, data robustness can be further enhanced by including data determination circuitry 630 on memory device 600. Data determination circuitry 630 is configured to determine individual bits of data from the state of the reference portions of multiple memory cells. For example, each of bits 611-613 may correspond to one-half of a corresponding high-low pair of memory cells, where the other half corresponds to one of memory cells 614-616. Thus each pair of memory cells 611 and 614, 612 and 615, and 613 and 616 stores a single bit of information, where the first memory cell in each pair is referenced to the second memory cell. Thus, pair 611 and 614 stores the same data bit (e.g. "0") as pair 613 and 616, whereas pair 612 and 615 stores a different data bit (e.g. "1"). Pair 611 and 614 have the first memory cell 611 in a first state and the second memory cell 614 in the second state, whereas pair 612 and 615 is the opposite in that the first memory cell 612 is in the second state and the second memory cell 615 is in the first state.

In other embodiments, the data determination circuitry 630 acts as a majority detector to determine a single bit of data from multiple memory cells. While storing the data in the reference portion a memory cell is more robust in terms of heat and magnetic field tolerance than storage using the free portion, in some embodiments, the data stored in even the reference portion of some memory cells may be compromised. For example, all of memory cells 611-613 may have been intended to store the same state, but memory cell 612 was compromised during an operation such as burn-in or wave soldering. If each of memory cells 611-613 stored a single bit of data by itself, the data bit stored in memory cell 612 would be compromised. However, if a single bit of data is stored by forcing the reference portions of all three of memory cells 611-613 into the same state, a majority determination can be used to determine the stored data bit such that errors in less than half of the memory cells would still result in valid data being recovered. For example, because both memory cells 611 and 613 retain the desired state, the majority detector will override the error in memory cell 612 and recover the correct data bit stored by memory cells 611-613. Other redundant data storage techniques can be used in association with data storage in the reference portion of memory cells in order to provide robust ROM-like data storage that is less-susceptible to corruption.

Figure 10:
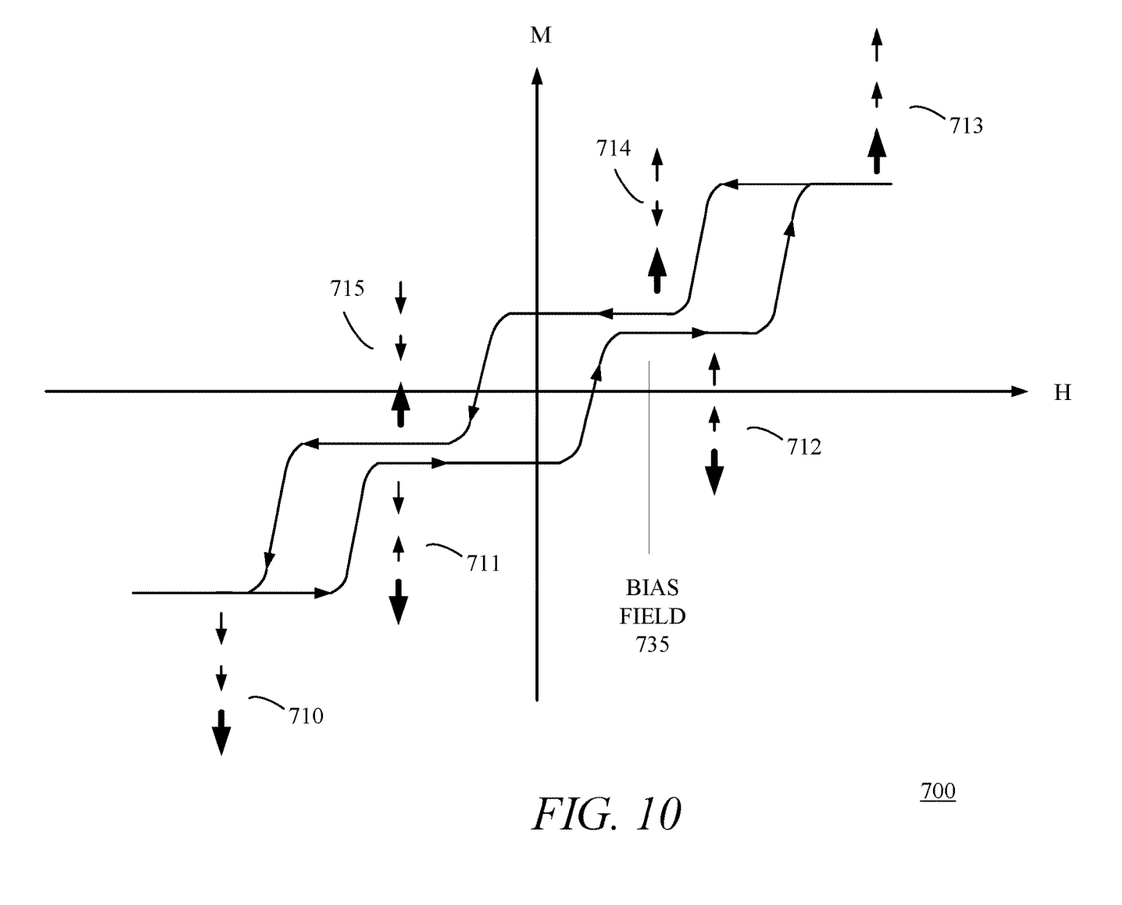
FIG. 10 is a graph that illustrates the magnetic moment transitions for a plurality of magnetic memory cells in accordance with an exemplary embodiment.

FIG. 10 shows a graph 700 that tracks the magnetic moment of an array of magnetic memory cells that are included in a magnetic memory in accordance with one embodiment. The x-axis corresponds to an applied external magnetic field (H), and the y-axis reflects the total magnetic moment of the memory cells. Each of the points on the graph 710-715 indicates the state of all of the memory cells in the memory at that point on the graph, where the three arrows represent the magnetic moment of the each of the magnetic layers in the memory cell (e.g. layers 210, 232, and 236 of memory cell 200 shown in FIGS. 5 and 6). While the example of FIG. 10 illustrates memory cells that include a SAF with layers 232 and 236, it is understood that other memory cell structures can be used.

In normal operation in which the free layer is used to store data, the memory device operates with no external magnetic field applied. As such, spin-torque current applied through the memory cells can cause the free layers of the memory cells to switch between magnetic states to store data. FIG. 10 is intended to help illustrate how programming of the magnetization states of the reference portions of the memory cells is accomplished in the presence of an external magnetic field during, for example, testing or wafer probe.

As shown in FIG. 10, when a very strong negative magnetic field is applied (far to the left on the x-axis), all of the layers 210, 232, and 236 have a downward-directed magnetic moment that corresponds to point 710. As the negative magnetic field is reduced in magnitude, the loop is followed to the right and next reaches point 711 at which the external magnetic field no longer forces layer 232 in the downward direction, and the antiferromagnetic coupling between layers 232 and 236 results in the magnetic moment of layer 232 being directed upward and opposite that of layer 236. The gradual transition from point 710 to 711 on the curve corresponds to the gradual transition of a few, then many, and finally all of the memory cells from the state corresponding to 710 to that corresponding to 711. In other words, the jump from 710 to 711 is not instantaneous as some of the memory cells will remain in the state corresponding to 710 while others are in the state corresponding to 711 for the particular magnetic fields along the curve between 710 and 711.

Continuing along the curve, when a positive magnetic field having a sufficient magnitude is applied, the free layers 210 of the memory cells are forced to change from pointing downward to pointing upward. At point 712, the magnetic field is sufficient that the magnetic moments of all of the free layers are necessarily directed upward. However, the magnetic field by itself is not strong enough to force the reference layers of the memory cells to change state. At point 713, the magnetic field magnitude has been increased to the point where all of the magnetic moments in layers 210, 232, and 236 are directed upward.

Continuing to follow the curve along the path indicated by the arrows, at 714, the magnetic moment of the free layer 210 is still forced to be in the upward direction, but the magnetic moment of layer 232 is no longer forced upwards and instead is directed downwards based on the antiferromagnetic coupling with layer 236. At 715, a negative magnetic field of sufficient magnitude is present such that all of the free layers 210 are forced to point downwards, but the field is not strong enough to force the reference layer 236 to switch.

The curve of FIG. 10 helps to illustrate that the memory cells used in the various embodiments described herein can be biased with a magnetic field in a way that allows the application of a reasonable-magnitude write current through the memory cell to force the reference layer for the cell into a desired magnetization state. As shown in FIG. 10, if a bias field 735 is applied to the memory device, the magnetic moment of all of the free layers 210 for all of the memory cells is "stabilized" and forced to be in the upward pointing direction. In addition to stabilizing the free layers and holding magnetic moment of the free layers 210 in a particular direction, the magnetic field applies torque to the reference layers of the memory cells that de-stabilizes those reference layers which are in the state shown for point 712. While the torque from the magnetic field alone is not sufficient to force the magnetic moment of the reference layers 236 to change state, with the additional application of a write current through selected magnetic memory cells, the combined torque from the magnetic field and the spin-torque current is sufficient to cause the reference layer in those selected memory cells to switch states. Thus, the bias field 735 de-stabilizes the reference portion of the memory cell such that it can be selectively programmed using spin-torque write currents applied to selected memory cells. The destabilization enables the spin-torque write current to be reasonable in magnitude such that it is below a level of current that would cause any of the magnetic tunnel junctions in the memory cell to break down. In other words, when the bias field 735 is applied, the voltage applied across the memory cell to generate the needed write current is non-destructive in that it is below the breakdown voltage for all the memory cells.

Thus, the bias field 735 represents a magnetic field having a selected magnitude that is applied when programming data into the reference layers of the magnetic memory cells. As can be seen, when the bias field 735 is applied, memory cells can exist either in the state corresponding to point 714 or the state corresponding to point 712. Assuming the memory cells are symmetrical in magnetic characteristics, a similar bias field corresponds to the points 711 and 715, where the free layers are forced in the downward direction, but the reference layers can be manipulated by applying additional torque via a write current. Having memory cells that support such a magnetic field bias point allows the reference portions of the memory cells to be programmed reliably in a manner that is non-destructive as limited write current is required. For example, in a memory cell that includes a SAF, the SAF is designed to have a low-enough energy barrier at the bias field to allow the SAF to switch when a non-destructive current is applied through the memory cell.

The structure of the free and reference portions of the memory cells are designed and implemented to support programming as described herein. Thus, the memory cell structure is such that when exposed to an external magnetic field of a selected magnitude (e.g. bias field 735), the free portion is held in a known magnetization state (e.g. the magnetic moment directed upwards as at points 712 and 714), and the reference portion of the memory cell is forced to a desired programmed state only when a current having a non-destructive magnitude is applied through the memory cell. Under the bias field, if no current flows through the memory cell, the state of the reference portion will remain unchanged. The materials and layer thicknesses used in the memory cell are chosen according to the requirements described above, including margin for the cell-to-cell variation of such properties within a memory array and from array to array in a production process.

By storing data in the reference layers of magnetic memory devices, more robust data retention is possible, thereby allowing data programmed during manufacturing of a memory to be retained after packaging and soldering onto a system printed circuit board. The underlying data stored in the reference layer does not interfere with the ability of the free layer to be used for read/write operations as in conventional MRAMs. Further levels of redundancy can be achieved by storing multiple copies of the same data in different portions of the memory.

Although the described exemplary embodiments disclosed herein are directed to various magnetoresistive-based devices, the present disclosure is not necessarily limited to the exemplary embodiments. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of operation of a magnetoresistive memory, wherein the magnetoresistive memory includes plurality of non-volatile magnetoresistive memory cells, wherein each memory cell includes a reference portion and a free portion, wherein during normal operation, data is written into each memory cell by forcing a magnetic moment of the free portion into one of a parallel and an antiparallel orientation with respect to a magnetic moment of the reference portion, the method comprising:
   lowering a switching barrier for the reference portion of each memory cell of the plurality of memory cells; and
   after lowering the switching barrier:
      for a first set of memory cells of the plurality of memory cells, applying a first current through each of the memory cells in the first set, wherein the first current is sufficient to force the reference portion of each memory cell to a first state.

2. The method of claim 1 further comprising:
   for a second set of memory cells of the plurality of memory cells, applying a second current through each of the memory cells in the second set, wherein the second current is sufficient to force the reference portion of each memory cell to a second state.

3. The method of claim 1, further comprising:
   before lowering the switching barrier, forcing the reference portion of each memory cell of the plurality of memory cells to a second state.

4. The method of claim 3, wherein forcing the reference portion of each memory cell of the plurality of memory cells to the second state includes applying an orienting magnetic field to the memory.

5. The method of claim 3, wherein lowering the switching barrier includes applying an external magnetic field to the memory, wherein the external magnetic field is insufficient to switch the reference layer of each memory cell from the second state to the first state without applying the first current through the memory cell.

6. The method of claim 5, wherein lowering the switching barrier includes exposing the memory to an elevated temperature while applying the external magnetic field, wherein a combination of the elevated temperature and the external magnetic field is insufficient to switch the reference layer of each memory cell from the second state to the first state without applying the first current through the memory cell.

7. The method of claim 1, wherein the reference portion of each memory cell of the plurality of memory cells includes an unpinned synthetic antiferromagnetic structure (SAF).

8. A method of operation of a magnetoresistive memory, wherein the magnetoresistive memory includes plurality of non-volatile magnetoresistive memory cells, wherein each memory cell includes a reference portion and a free portion, wherein during normal operation, data is written into each memory cell by forcing a magnetic moment of the free portion into one of a parallel and an antiparallel orientation with respect to a magnetic moment of the reference portion, the method comprising:
   forcing the free portion of a selected memory cell of the plurality of memory cells to a known state corresponding to a known orientation of the magnetic moment of the free portion;
   after forcing the free portion of the selected memory cell to the known state, sampling an initial resistance through a selected memory cell of the plurality of memory cells;
   after sampling the initial resistance, applying a write current through the selected memory cell;
   after applying the write current, sampling a resulting resistance through the selected memory cell; and
   comparing the resulting resistance with the initial resistance to determine a state of the reference portion of the selected memory cell.

9. The method of claim 8, wherein forcing the free portion of the selected memory cell includes applying an external magnetic field to the memory, wherein the external magnetic field forces the free portion of each memory cell of the plurality of memory cells to the known state.

10. The method of claim 8, wherein applying the write current further comprises applying an up-current through the selected memory cell.

11. The method of claim 8, wherein the reference portion of each memory cell of the plurality of memory cells includes an unpinned synthetic antiferromagnetic structure (SAF).

12. A magnetoresistive memory, comprising:
   a plurality of non-volatile magnetoresistive memory cells, wherein each memory cell includes a reference portion and a free portion, the plurality of memory cells including:
      a first set of memory cells having a reference portion with a first magnetic state; and
      a second set of memory cells having a reference portion with a second magnetic state, wherein the first magnetic state is different than the second magnetic state; and
   control circuitry coupled to the plurality of memory cells, the control circuitry configured to read data stored in the reference portion of a first selected memory cell of the plurality of memory cells, wherein the control circuitry is configured to:
      sample an initial resistance through the first selected memory cell;
      after sampling the initial resistance, apply a first write current through the first selected memory cell;
      after applying the first write current, sampling a resulting resistance through the first selected memory cell; and
      comparing the resulting resistance with the initial resistance to determine whether the first selected memory cell is included in the first set of memory cells or the second set of memory cells.

13. The memory of claim 12, wherein each memory cell of the plurality of memory cells is a spin-torque magnetoresistive memory cell.

14. The memory of claim 13, wherein the reference portion of each memory cell includes an unpinned synthetic antiferromagnetic structure (SAF).

15. The memory of claim 12, wherein for each memory cell of the plurality of non-volatile magnetoresistive memory cells the reference portion and the free portion are such that when an external magnetic field of a selected magnitude is applied to the memory cell:
   the free portion is held in a known magnetization state corresponding to the external magnetic field; and
   the reference portion of the memory cell: i) is forced to a programmed state when a current having a non-destructive magnitude is applied through the memory cell; and ii) remains unchanged when the current having a non-destructive magnitude is not applied.

16. The memory of claim 12, wherein the control circuitry is further configured to write data into a second selected memory cell by applying a write current through the second selected memory cell to force the free portion of the second selected memory cell to have a magnetic moment that is either parallel or antiparallel to a magnetic moment of the reference portion of the second selected memory cell.

17. The memory of claim 16, wherein the control circuitry is further configured to read data stored in the free portion of the second selected memory cell using a self-referenced read that determines whether the magnetic moment of the free portion of the second selected memory cell is parallel or antiparallel to the magnetic moment of the reference portion of the second selected memory cell.

18. The memory of claim 12 further comprising data determination circuitry coupled to the plurality of memory cells and the control circuitry, wherein the data determination circuitry determines data stored in the memory by comparing a data state stored in the reference layer of a first memory cell with a data state stored in the reference layer of a second memory cell.

19. The memory of claim 18, wherein the data determination circuitry includes a majority detector, wherein the majority detector compares the data states of the first and second memory cells with a data state of at least a third memory cell.

20. The memory of claim 18 wherein the first memory cell and the second memory cell are a high-low pair of memory cells in which the first memory cell is referenced to the second memory cell.

* * * * *